United States Patent
Chen et al.

(10) Patent No.: US 6,586,875 B1
(45) Date of Patent: Jul. 1, 2003

(54) LIGHT EMITTING DIODE WITH LOW-TEMPERATURE SOLDER LAYER

(75) Inventors: Tzer-Perng Chen, Hsinchu (TW); Chih-Sung Chang, Taipei (TW); Kuang-Neng Yang, Yunlin (TW)

(73) Assignee: United Epitaxy Company, Inc., Hsinchu (TW)

( * ) Notice: Subject to any disclaimer, the term of this patent is extended or adjusted under 35 U.S.C. 154(b) by 188 days.

(21) Appl. No.: 09/717,020

(22) Filed: Nov. 22, 2000

(30) Foreign Application Priority Data

Aug. 10, 2000 (TW) ......................... 89116141 A

(51) Int. Cl.[7] ............................................. H01J 63/04
(52) U.S. Cl. ....................................... 313/506; 313/499
(58) Field of Search ................................ 313/498, 499, 313/506, 512; 257/86, 94, 96, 97, 98, 99, 103

(56) References Cited

U.S. PATENT DOCUMENTS

| | | | | |
|---|---|---|---|---|
| 4,366,186 A | * | 12/1982 | Keramidas et al. | ......... 136/256 |
| 4,946,801 A | * | 8/1990 | Sato et al. | ................. 148/33.4 |
| 5,048,035 A | * | 9/1991 | Sugawara et al. | ............ 257/94 |
| 5,237,581 A | * | 8/1993 | Asada et al. | .................... 257/98 |
| 6,287,882 B1 | * | 9/2001 | Chang et al. | ................. 438/29 |
| 6,358,316 B1 | * | 3/2002 | Kizuki et al. | ................ 117/105 |

* cited by examiner

Primary Examiner—Ashok Patel
Assistant Examiner—Glenn Zimmerman
(74) Attorney, Agent, or Firm—Sughrue Mion, PLLC

(57) ABSTRACT

A light emitting diode (LED) is disclosed. An emitting light absorbed by a substrate can be prevented by using a metal with high conductibility and high reflectivity and a bonding process can be produced at a lower temperature and a better welding performance can be obtained by using a solder layer could be fused into a liquid-state. Furthermore, an industry standard vertical LED chip structure is provided and only, requiring a single wire bond that results in easy LED assembly and the manufacture cost can be reduced. An LED chip size can be greatly reduced and with good heat dissipation, therefore the LED has better reliability performance and can be operated at much higher current.

15 Claims, 3 Drawing Sheets

LIGHT EMITTING DIODE WITH LOW-TEMPERATURE SOLDER LAYER

FIELD OF THE INVENTION

The present invention relates to a light emitting diode (LED) chip structure, and more particularly to a AlGaInP and a AlGaAs LED structures.

BACKGROUND OF THE INVENTION

Figure 4:
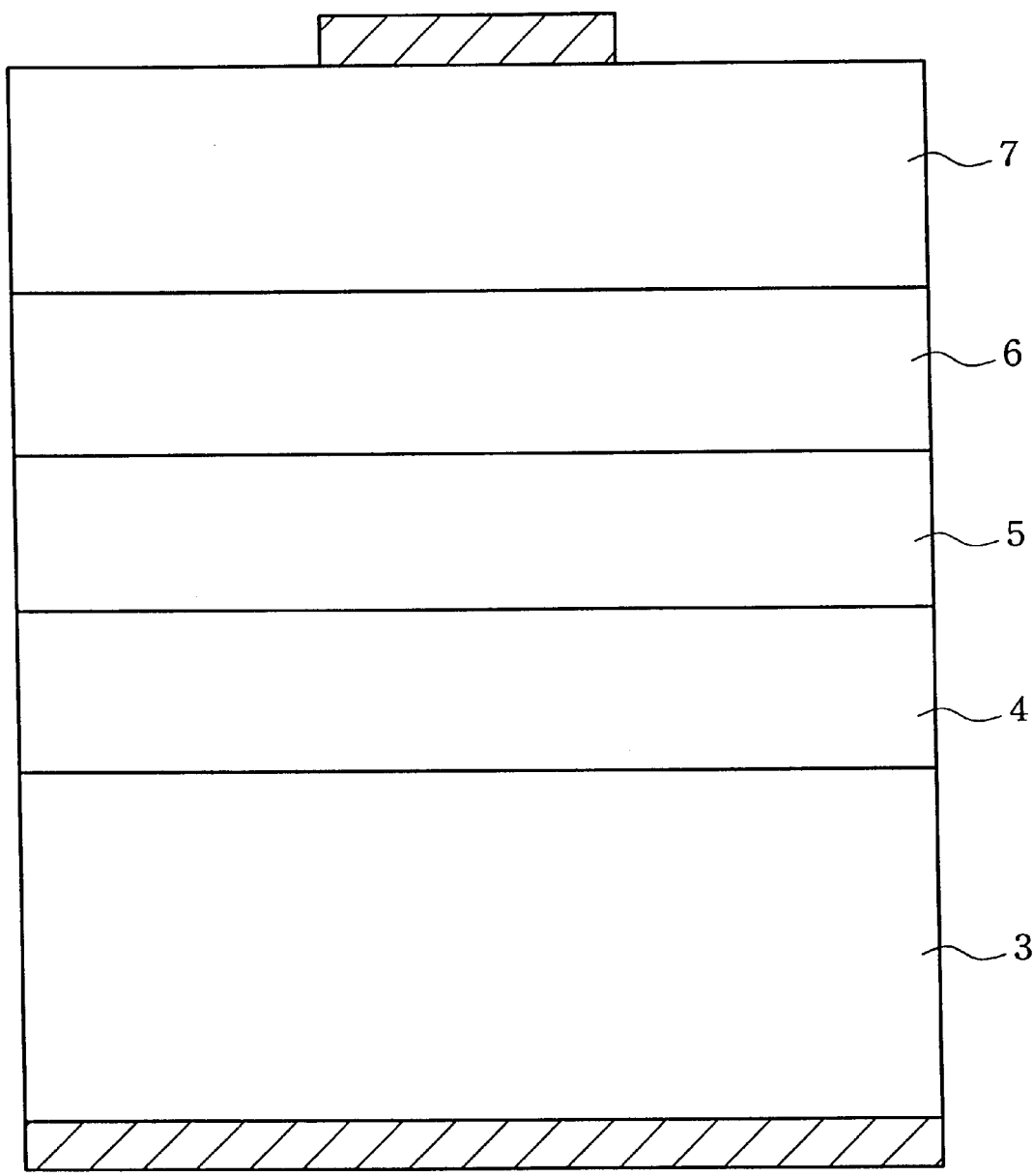

The conventional AlGaInP LED, as shown in FIG. 4, has a double heterostructure (DH), which is consisted of an n-type $(Al_xGa_{1-x})_{0.5}In_{0.5}P$ lower cladding layer 4 with a Al dosage of about 70%~100%, formed on an n-type GaAs substrate 3, a $(Al_xGa_{1-x0.5}In_{0.5}P$ active layer 5, a p-type $(Al_xGa_{1-x})_{0.5}In_{0.5}P$ upper cladding layer 6 with a Al dosage 70%~100% and a p-type high energy gap GaP or AlGaAs current spreading layer 7. The emitting wavelength of the conventional LED structure can be changed by changing composition of the active layer to generate a wavelength light changed from 650 nm red light to 555 nm pure green light. One disadvantage of the conventional LED is that, when the light generated by the active layer is emitted deep to the GaAs substrate, the light will be absorbed by the GaAs substrate since the GaAs substrate has a lesser energy gap. Accordingly, the performance of the LED will be greatly reduced.

There are some conventional LED technologies have been disclosed in order to avoid the absorption of light by the substrate. However, these conventional technologies still have some disadvantages and limitations. For example, Sugawara et al. disclosed a method, which has been published in Appl. Phys Lett. Vol. 61, 1775–1777 (1992), that adding a distributed bragg reflector (DBR) layer on the GaAs substrate so as to reflect the light ejected to the GaAs substrate and to decrease the light absorbed by the GaAs substrate. However, because the DBR layer only can effectively reflect the light approximated to verticality ejected to the GaAs substrate, so that the efficiency is not very great.

Kish et al. disclosed a wafer-bonded transparent-substrate (TS) $(Al_xGa_{1-x})_{0.5}In_{0.5}P/GaP$ light emitting diode [Appl. Phys Lett. Vol. 64, No. 21, 2839 (1994); Very high-efficiency semiconductor wafer-bonded transparent-substrate $(Al_xGa_{1-x})_{0.5}In_{0.5}P/GaP$]. This TS AlGaInP LED was fabricated by growing a very thick (about 50 μm) p-type GaP window layer using hydride vapor phase epitaxy (HVPE) together at a temperature above the eutectic point of AuSn solder. After bonding, the n-type GaAs substrate was selectively removed using conventional chemical etching techniques. The exposed n-type layers subsequently wafer-bonded to 8–10 mil thick n-type GaP substrate. The resulting TS AlGaInP LED exhibit a two fold improvement in light output compared to absorbing substrate (AS) AlGaInP LED. However, the fabrication process of TS AlGaInP LED is too complicated. Therefore, it is difficult to manufacture these TS AlGaInP LEDs in high yield and low cost.

Horng et al. reported a mirror-substrate (MS) AlGaInP/metal/SiO$_2$/Si LED fabricated by wafer-fused technology [Appl. Phys Lett. Vol. 75, No. 20, 3054 (1999); AlGaInP light-emitting diodes with mirror substrates fabricated by wafer bonding]. They used the AuBe/Au as the adhesive to bond the Si substrate and LED epilayers. However, the luminous intensity of these MS AlGaInP LEDs is about 90 mcd with 20 mA injection current and is still 40% lower than the luminous intensity of TS AlGaInP LED. Besides, both p-electrode and n-electrode are formed on the same side, so that the chip size can not be decreased. Therefore, the chip size is larger than conventional LED chip that has p-electrode on one side and n-electrode on the other side. Thus, this type of LED chip is difficult to satisfy a case of a package size compatible with the trend toward miniaturization.

SUMMARY OF THE INVENTION

As described above, the conventional LED has many disadvantages. Therefore, the present invention provides a LED structure and method of making the same to solve the conventional disadvantages.

The present invention provides a light emitting diode. The light emitting diode comprises a epitaxial structure has a plurality of III–V compound semiconductor layers and can generate light with injection current, a silicon substrate has a first ohmic contact metal layer on one side and a second ohmic contact metal layer on the other side and a low-temperature solder layer for bonding the epitaxial structure and the silicon substrate together.

The present invention provides a method for manufacturing a light emitting diode, which comprises the steps of: providing a epitaxial structure, the epitaxial structure has a plurality of III–V compound semiconductor layers and can generate light with injection current; providing a silicon substrate, the silicon substrate has a first ohmic contact metal layer on one side and a second ohmic contact metal layer on the other side; and, providing a low-temperature solder layer for bonding the epitaxial structure and the silicon substrate together.

An advantage of the present invention is to provide a vertical LED chip structure requiring a single wire bond that results in easy LED assembly and the manufacture cost can be reduced.

An advantage of the present invention is a bonding process can be produced at a lower temperature and a better welding performance can be obtained.

An advantage of the present invention is an LED chip size can be greatly reduced and compatible with the trend toward miniaturization, particularly in surface mount LED applications and saving the material cost.

An advantage of the present invention is with good heat dissipation, therefore the LED has better reliability performance and can be operated at much higher current.

An advantage of the present invention is very easy to mass-produce in high yield and lower cost.

BRIEF DESCRIPTIONS OF THE DRAWINGS

Figure 1:
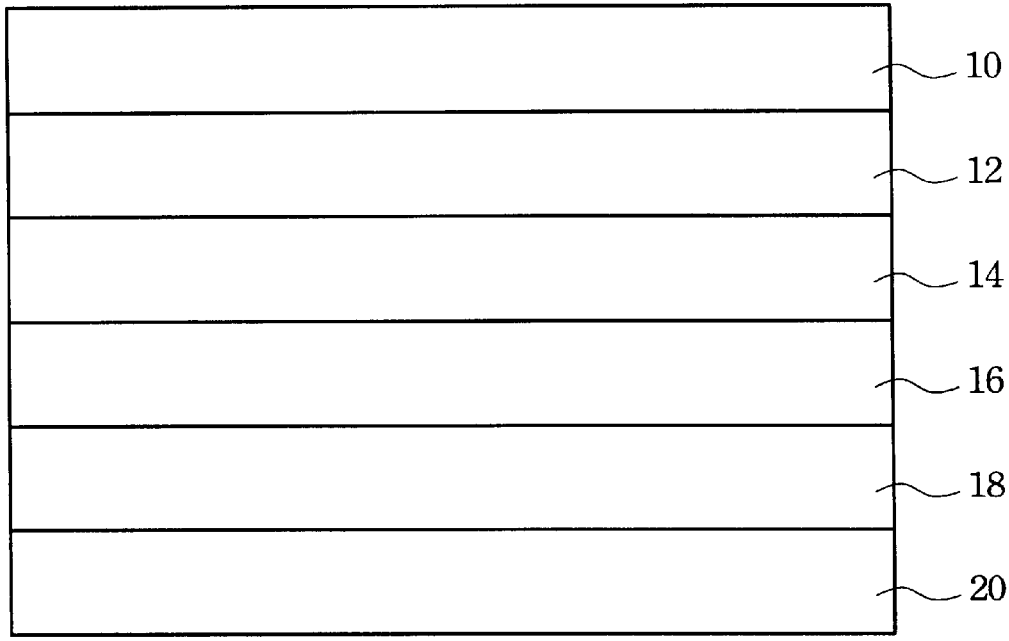
Figure 2:
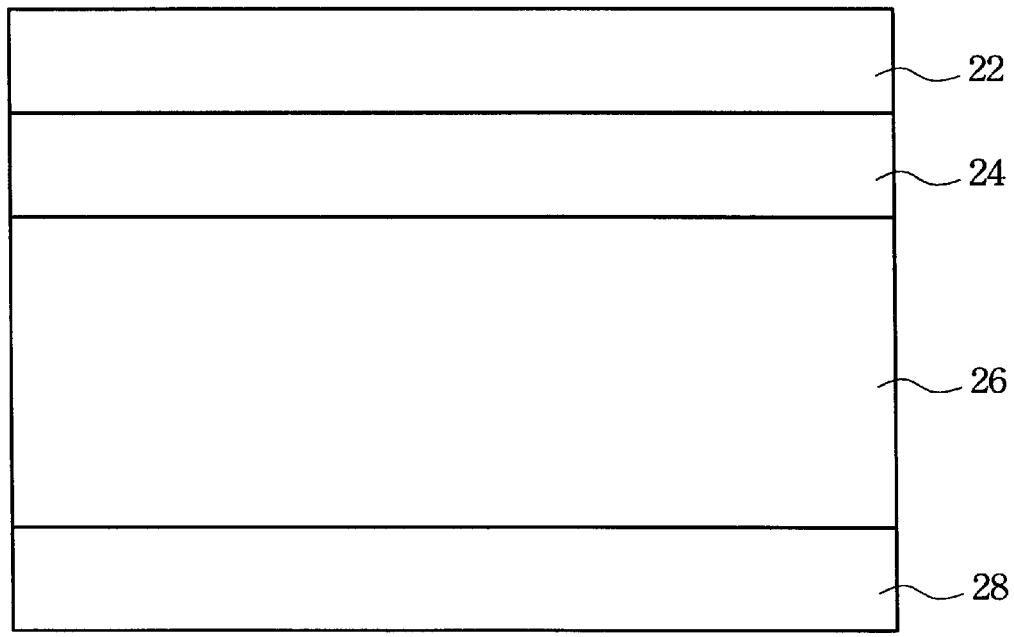
Figure 3:
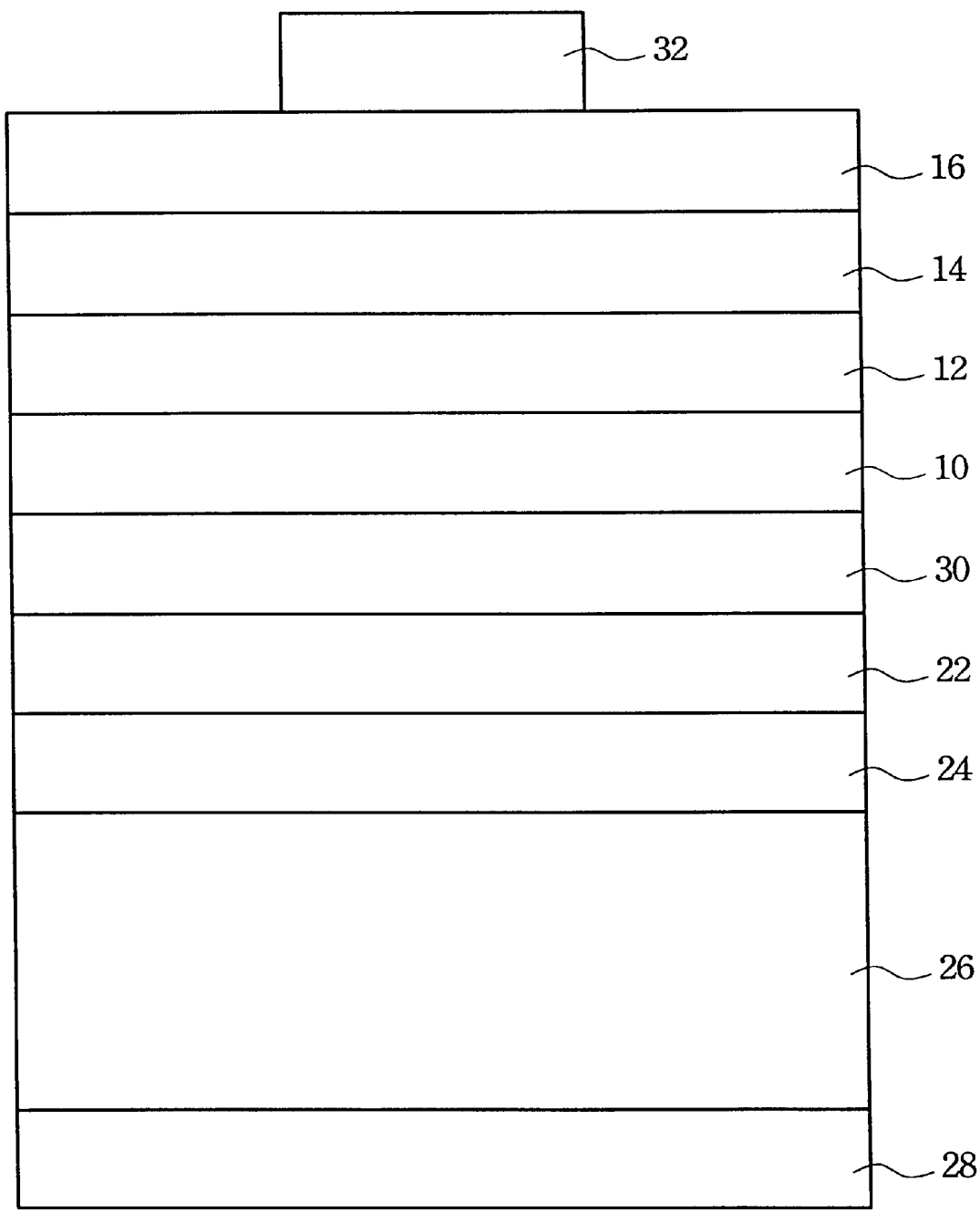

FIGS. 1–3 are schematic, cross-sectional views of the process for manufacturing a light emitting diode in a preferred embodiment according to the present invention; and FIG. 4 shows a schematic view of a structure of a conventional light emitting diode.

DETAILED DESCRIPTIONS OF THE INVENTION

The present invention discloses an LED structure and method of making the same and will be described in detail as below.

Referring to FIG. 1, the epitaxial structure of light emitting diode of the present invention is consisted of an n-type GaAs substrate 20, an etching stop layer 18, an n-type $(Al_xGa_{1-x})_{0.5}In_{0.5}P$ lower cladding layer 16 with a Al dosage of about $0 \leq x \leq 0.45$, a $(Al_xGa_{1-x})_{0.5}In_{0.5}P$ active layer 14 with a Al dosage of about $0 \leq x \leq 0.45$, a p-type $(Al_xGa_{1-x})_{0.5}In_{0.5}P$ upper cladding layer 12 and a p+-GaAs cap layer 10. The preferred thickness of the p+-GaAs cap layer 10 is about less than 1000 Å.

In the above description, the ratio of the compound such as $(Al_xGa_{1-x})_{0.5}In_{0.5}P$ is a preferred example, the invention is also applied to any ratio of the compound with other materials. In addition, the structure of the AlGaInP active layer 14 of the invention could be a DH structure or a multiple quantum well (MQW) structure. The DH structure comprises the n-type $(Al_xGa_{1-x})_{0.5}In_{0.5}P$ lower cladding layer 16 with a Al dosage of about $0.5 \leq x \leq 1$, a $(Al_xGa_{1-x})_{0.5}In_{0.5}P$ active layer 14 and a p-type $(Al_xGa_{1-x})_{0.5}In_{0.5}P$ upper cladding layer 12 with a Al dosage of about $0.55 \leq x \leq 1$, as shown in FIG. 1, wherein the preferred thicknesses of the lower cladding layer 16, the active layer 14 and the upper cladding layer 12 are about 1.0, 0.75 and 1.0 μm, respectively.

The material of the etching stop layer 18 of the invention can be any III–V compound semiconductor material that has a lattice matched with that the GaAs substrate 20. The material of the etching stop layer 18 of the invention also has a etching rate much smaller than that of the GaAs substrate 20. For example, GaInP or AlGaAs can be good candidates of the etching stop layer 18.

The structure as shown in FIG. 2 comprises a AuSn alloy solder layer 22, a ohmic contact metal layer 24, a Si substrate 26 and another ohmic contact metal layer 28. The material of the solder layer 22 is not limited to AuSn alloy. Any conductive adhesion materials, such as PbSn alloy, GeAu, BeAu or In, that can be fused at a lower temperature, is also applicable to the invention. The AuSn alloy can be fused at a lower temperature, therefore the process temperature of the invention can be much lower than the conventional process temperature.

Then, a p-type ohmic contact metal layer 30, such as gold (Au), was deposited on the p+-GaAs cap layer 10 of FIG. 1. The p+-GaAs cap layer 10 is, for example, has a carrier concentration higher than $10^{19} cm^{-3}$ to form a non-alloy ohmic contact. Besides, the thickness of the p+-GaAs cap layer 10 is preferred thinner to avoid the absorption of light emitted by the active layer. Similarly, the material of the p-type ohmic contact metal layer 30 is not limited to Au. Any material, for example, Al or Ag, with high reflectivity and high conductivity is also applicable to the invention. Furthermore, the p-type ohmic contact metal layer 30 is used as a high reflectivity mirror in order to avoid the absorption of light by the substrate and the decreasing of the luminous intensity of the emitting light.

In the structure of FIG. 2, the AuSn alloy solder layer 22 is used as a connection layer and is connected to the p-type ohmic contact metal layer 30 of FIG. 1. The method of connecting the AuSn alloy solder layer 22 and the p-type ohmic contact metal layer 30 comprises, for example, raises the temperature above the eutectic point of AuSn alloy in order to fuse the AuSn alloy presented in a solid-state into a liquid-state. Because, the ohmic contact metal layer 30 contacts with the AuSn alloy solder layer 22, the AuSn alloy 22 in a liquid-state would be therefore restituted into a solid-state and then welded together with the ohmic contact metal layer 30 when the temperature reduces. Thus, the epitaxial layer structure of FIG. 1 can be welded together with the structure of FIG. 2. The weld process can be performed in a lower temperature according to the method of the invention. In addition, because the solder layer 22 exhibits a liquid-state in a welding process, a welding efficiency obtained by the present invention is better than that of the conventional solid-state pressure welding technology.

In processes, because the fused-state solder layer 22 is directly contacted with the metal layer 30, the metal layer 30 can be formed with a high thickness in order to avoid the fusion of a region or whole layer of the metal layer 30 and the destruction of the characteristic of the mirror reflectivity. Another method of preventing the fusion of a region or whole layer of the metal layer 30 comprises the step of providing an anti-fused layer (not shown), such as Pt, Mo or W layer between the metal layer 30 and the solder layer 22. The Pt, Mo or W layers and the AuSn alloy are difficult to welded together, thus a metal layer also can be formed between the anti-fused layer and the solder layer to improve the problem of ropiness.

The light emitted from the active layer would be absorbed by GaAs substrate and the etching stop layer, therefore the etching stop layer 18 and the n-type GaAs substrate 20 was removed first by either wet chemical etching such as $5H_3PO_4:3H_2O_2:3H_2O$ or $1NH_4OH:35H_2O_2$ that exhibit an etch rate ratio of at least 1:100 for the GaInP versus GaAs or dry etching and the n-type AlGaInP lower cladding layer 16 would be exposed. If the thickness of the etching stop layer is not too thick, it is not necessary to remove the GaInP etching stop layer because the light absorption would be not so serious.

The LED chips were fabricated by depositing another ohmic contact metal layer 32 on the n-type AlGaInP lower cladding layer 16 as shown in FIG. 3, wherein an anneal process with low temperature may be performed. If the GaInP etching stop layer is not removed away, then the deposited ohmic contact metal layer 32 will be formed on the GaInP etching stop layer. A preferred material of the ohmic contact metal layer 32 is Ni/AuGe/Ni/Au. During a welding process according to the LED structure of the invention, a single lead is only necessary to weld the ohmic contact metal layer, therefore the size for the conventional LED chip that has p-electrode and n-electrode on the same side can be decreased.

When the Al dosage of the active layer is zero, the light output power of the present invention 645 nm AlGaInP LED is more than 4 mw (at 20 mA injection current) and is two times higher than the light output power of the conventional absorbing substrate AlGaInP LED. The light output power of the present invention LED also increase linearly with injection current even above 100 mA. It proves that the Si wafer provides a much better heat sinking capability than conventional GaAs substrate.

The present invention not only applied to the AlGaInP LED but also applied to (AlGa)As LED. A (AlGa)As red LED with a wavelength at 650 nm is described as an example with reference to FIG. 1, the epitaxial structure of the invention stacked sequentially comprises an n-type GaAs substrate 20, an n-type etching stop layer 18, an n-type $(Al_xGa_{1-x})As$ lower cladding layer 16, a pure $(Al_xGa_{1-x})$ active layer 14, a p-type $(Al_xGa_{1-x})As$ upper cladding layer 12 and a p+-GaAs cap layer 10. The lower cladding layer 16 and the upper cladding layer 12 both have a Al dosage of about 70%~85% and the active layer 14 have a Al dosage of about 35% corresponded to a light-emitting wavelength at 650 nm. The chip has the epitaxial structure and the silicon wafer of FIG. 2 was then welded together via the AuSn alloy solder layer 22. After bonding, the etching stop layer 18 and the n-type GaAs substrate were removed by chemical etching or dry etching. The LED chip was fabricated by depositing a ohmic contact metal layer 32 on the n-type (Al$_x$Ga$_{1-x}$)As lower cladding layer 16 (as shown in FIG. 3).

The light output power of the present invention 650 nm AlGaAs LED is two times higher than the light output power of the conventional absorbing substrate AlGaAs LED. The AlGaAs LED of the present invention has a wavelength but not limited at 650 nm, that is, changing the Al dosage of the AlGaAs active layer can change the light-emitting wavelength of the LED from red lights to infrared rays.

According to the above description, the present invention has following advantages:

(1) An industry standard vertical LED chip structure requiring a single wire bond that results in easy LED assembly, reduced manufacturing costs.

(2) A smaller chip size compatible with the trend toward miniaturization, particularly in surface mount LED applications and saving the material cost.

(3) A bonding process can be produced at a lower temperature and a better welding performance can be obtained.

(4) With good heat dissipation, therefore, the LED has better reliability performance or can be operated at much higher current.

(5) Very easy to mass-produce in high yield and lower cost.

While the preferred embodiment of the invention has been illustrated and described, it will be appreciated that various changes can be made therein without departing from the spirit and scope of the invention.

What is claimed is:

1. A light emitting diode, comprising:
   a epitaxial structure has a plurality of III–V compound semiconductor layers to generate light with injection current;
   a silicon substrate has a first ohmic contact metal layer on one side and a second ohmic contact metal layer on the other side; and
   a low-temperature solder layer for bonding the epitaxial structure to the first ohmic contact metal layer of the silicon substrate.

2. The light emitting diode according to claim 1, wherein the low-temperature solder layer is composed of a material selected from a group of AuSn alloy, PbSn alloy GeAu, BeAu and In.

3. The light emitting diode according to claim 1, further comprises a ohmic contact metal layer with a high reflectivity formed on the epitaxial structure.

4. The light emitting diode according to claim 3, further comprises an anti-fused metal layer formed between the ohmic contact metal layer with the high reflectivity and the low-temperature solder layer.

5. The light emitting diode according to claim 3, wherein the ohmic contact metal layer with the high reflectivity is composed of a material selected from a group of Au, Al and Ag.

6. The light emitting diode according to claim 1, wherein the epitaxial structure comprises a surface cap layer has a carrier concentration higher than $10^{19}$cm$^{-3}$.

7. The light emitting diode according to claim 6, wherein the surface cap layer is GaAs.

8. The light emitting diode according to claim 1, wherein the epitaxial structure comprises a (Al$_x$Ga$_{1-x}$)$_{0.5}$In$_{0.5}$P active layer with a Al dosage of $0 \leq x \leq 0.45$.

9. The light emitting diode according to claim 8, wherein the epitaxial structure comprises a (Al$_x$Ga$_{1-x}$)$_{0.5}$In$_{0.5}$P upper cladding layer with a Al dosage of $0.5 \leq x \leq 1$.

10. The light emitting diode according to claim 8, wherein the epitaxial structure comprises a (Al$_x$Ga$_{1-x}$)$_{0.5}$In$_{0.5}$P lower cladding layer with a Al dosage of $0.5 \leq x \leq 1$.

11. The light emitting diode according to claim 1, wherein the epitaxial structure comprises a (Al$_x$Ga$_{1-x}$)As active layer.

12. The light emitting diode according to claim 11, wherein the epitaxial structure comprises a (Al$_x$Ga$_{1-x}$)As upper cladding layer.

13. The light emitting diode according to claim 11, wherein the epitaxial structure comprises a (Al$_x$Ga$_{1-x}$)As lower cladding layer.

14. The light emitting diode according to claim 11, wherein the epitaxial structure comprises an active layer has a quantum well structure.

15. A light emitting diode, comprising:
   an epitaxial structure has a plurality of III–V compound semiconductor layers to generate light with injection current, wherein a first ohmic contact metal is formed on one side of the epitaxial structure, and a second ohmic contact metal is formed on the other side of the epitaxial structure;
   a silicon substrate has a third ohmic contact metal layer on one side and a fourth ohmic contact metal layer on the other side; and
   a low-temperature solder layer for bonding the third ohmic contact metal layer of the silicon substrate to the second ohmic contact metal layer of the epitaxial structure.

* * * * *

UNITED STATES PATENT AND TRADEMARK OFFICE
CERTIFICATE OF CORRECTION

PATENT NO. : 6,586,875 B1
DATED : July 1, 2003
INVENTOR(S) : Tzer-Perng Chen, Chih-Sung Chang, and Kuang-Neng Yang It is certified that error appears in the above-identified patent and that said Letters Patent is hereby corrected as shown below:

<u>Title page,</u>
Item [73], Assignee, change "United Epitaxy Company, Inc.," to -- United Epitaxy Company, Ltd. --

Signed and Sealed this

Thirty-first Day of May, 2005

JON W. DUDAS
*Director of the United States Patent and Trademark Office*